United States Patent
Dobyns et al.

(10) Patent No.: US 7,158,137 B2
(45) Date of Patent: Jan. 2, 2007

(54) ARCHITECTURE FOR IMPROVED DISPLAY PERFORMANCE IN A SIGNAL ACQUISITION AND DISPLAY DEVICE

(75) Inventors: Kenneth P. Dobyns, Beaverton, OR (US); Paul M. Gerlach, Beaverton, OR (US); Donovan E. Hammer, Tualatin, OR (US); Stony D. Yakovac, Gaston, OR (US)

(73) Assignee: Tektronix, Inc., Beaverton, OR (US)

( * ) Notice: Subject to any disclaimer, the term of this patent is extended or adjusted under 35 U.S.C. 154(b) by 400 days.

(21) Appl. No.: 10/456,825

(22) Filed: Jun. 6, 2003

(65) Prior Publication Data

US 2003/0231187 A1 Dec. 18, 2003

Related U.S. Application Data

(60) Provisional application No. 60/387,154, filed on Jun. 6, 2002.

(51) Int. Cl.
*G06T 11/20* (2006.01)
*G01R 13/02* (2006.01)
*G06F 19/00* (2006.01)

(52) U.S. Cl. ........................ 345/440.1; 702/67; 702/71

(58) Field of Classification Search ............ 345/13–16, 345/440.1; 702/70–71
See application file for complete search history.

(56) References Cited

U.S. PATENT DOCUMENTS

| 5,740,064 | A | * | 4/1998 | Witte et al. | 702/70 |
| 5,986,637 | A | | 11/1999 | Etheridge et al. | |
| 6,163,758 | A | * | 12/2000 | Sullivan et al. | 702/66 |
| 6,222,521 | B1 | * | 4/2001 | Ivers et al. | 345/440.1 |
| 6,275,257 | B1 | * | 8/2001 | Tallman et al. | 348/184 |
| 6,473,701 | B1 | * | 10/2002 | Tallman et al. | 702/67 |
| 6,728,648 | B1 | * | 4/2004 | Letts | 702/71 |

* cited by examiner

*Primary Examiner*—Richard Hjerpe
*Assistant Examiner*—M. Fatahiyar
(74) *Attorney, Agent, or Firm*—Moser, Patterson & Sheridan, LLP; Thomas F. Lenihan

(57) ABSTRACT

A multiple channel signal acquisition device wherein each channel performs a respective rasterization process to provide respective waveform imagery, the respective waveform imagery having a display parameter reduced at a decay rate, the respective waveform imagery being propagated towards an adjacent input channel for combination, the combined image being propagated towards each remaining channel for combination into a final waveform image for display.

19 Claims, 2 Drawing Sheets

ARCHITECTURE FOR IMPROVED DISPLAY PERFORMANCE IN A SIGNAL ACQUISITION AND DISPLAY DEVICE

CROSS-REFERENCE TO RELATED APPLICATIONS

This patent application claims the benefit of U.S. Provisional Patent Application Ser. No. 60/387,154, filed on Jun. 6, 2002 for ARCHITECTURE FOR IMPROVED DISPLAY PERFORMANCE IN AN OSCILLOSCOPE, which is incorporated herein by reference in its entirety.

FIELD OF THE INVENTION

The invention relates generally to signal acquisition instruments and, more specifically, to a signal acquisition display architecture adapted for use within a digital storage oscilloscope (DSO) or other signal acquisition and display device.

BACKGROUND OF THE INVENTION

A high speed digital storage oscilloscope (DSO) architecture is depicted in U.S. Pat. No. 5,986,637 issued Nov. 16, 1999 to Etheridge et al. and incorporated herein by reference in its entirety. In this architecture, acquired data is stored in an acquisition memory and, upon occurrence of a trigger event, the stored data is aligned to the triggering event and processed by an acquisition rasterizer. The resulting raster data is stored in a display raster memory for subsequent display on a display device.

Because of the high processing power required to process the very high volume of data acquired by a DSO (or other test and measurement instruments), high performance oscilloscopes have traditionally used specialized custom integrated circuits to rasterize the waveform content. These integrated circuits often include the circuitry necessary to display a resultant image (i.e., a display controller) in addition to the rasterizing circuitry.

In one application, the rasterizer increases the intensity of (attacks) individual pixels with each new waveform and the display controller reduces the intensity of (decays) these pixels as they are moved to the screen. This scheme tends to emulate the characteristics of a traditional analog oscilloscope display (i.e., a cathode ray tube) where the brightness of a phosphor is increased by the display of new waveform content and reduced by the decay of the phosphor. In order to emulate the CRT, the display process needs to be at a constant rate with time.

While improving waveform throughput, the above architecture has several drawbacks. First, because the decay operation has been attached to the display process, this technique is unable to emulate the attack and decay characteristics of an analog CRT while achieving high waveform throughput. Each composite image represents a snapshot in time that is reset with each new raster/display cycle. Additionally, since modern high-speed oscilloscopes typically use multiple analog-to-digital converters feeding multiple memory controller (i.e., demux) parts, the high-speed rasterization takes place in multiple locations. In order to display these raster images, the images must be consolidated at a central location which, typically, comprises a specialized integrated circuit including display capabilities.

Finally, since there is still a strong desire to have a gray scale attack/display capability to emulate a traditional CRT display, these instruments have two display modes which reflect an undesirable modal behavior. In a first mode of operation, data is rasterized within the acquisition system and consolidated for display. In the second mode of operation, waveform data is moved to a central rasterizer that includes gray scale attack/display capability. Unfortunately, display update rates using these two modes of operation can differ by very large amounts.

SUMMARY OF INVENTION

These and other deficiencies of the prior art are addressed by the present invention of an architecture, apparatus and method adapted for use within a high speed signal acquisition and display device in which each of a plurality of input channels acquires respective data streams which are processed by respective rasterizers physically proximate the respective acquisition circuitry such that each respective input channel generates respective waveform imagery. Each of the rasterizers provides the ability to decay the raster image while new waveforms are being produced. A timer controls this decay capability so that it is performed at a desired rate. In this manner, each demux maintains a raster image that emulates the traditional attack/display characteristics of an analog CRT while simultaneously providing high throughput rates. Moreover, since there is no need to move waveform data to a second integrated circuit to gain this capability, the modal behavior that currently exists between high throughout and full gray scale attack/decay is eliminated.

In one embodiment of the invention, multiple raster images are composited "on the fly" between respective adjacent demux processing elements. Specifically, each demux processing element includes a high-speed point-to-point bus that is used to interleave the samples captured within multiple demux parts at the fastest sample rates. This bus is also utilized to move display images between the various demux processors, compositing them into a single image that can be displayed using an inexpensive commercial display IC.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of test and measurement devices such as digital storage oscilloscopes (DSOs). However, it will be appreciated by those skilled in the art that the invention may be advantageously employed in any environment where multiple signals are acquired for subsequent combined display as waveforms on a display device or where digital emulation of traditional attack/decay persistence of a waveform is desired.

Figure 1:
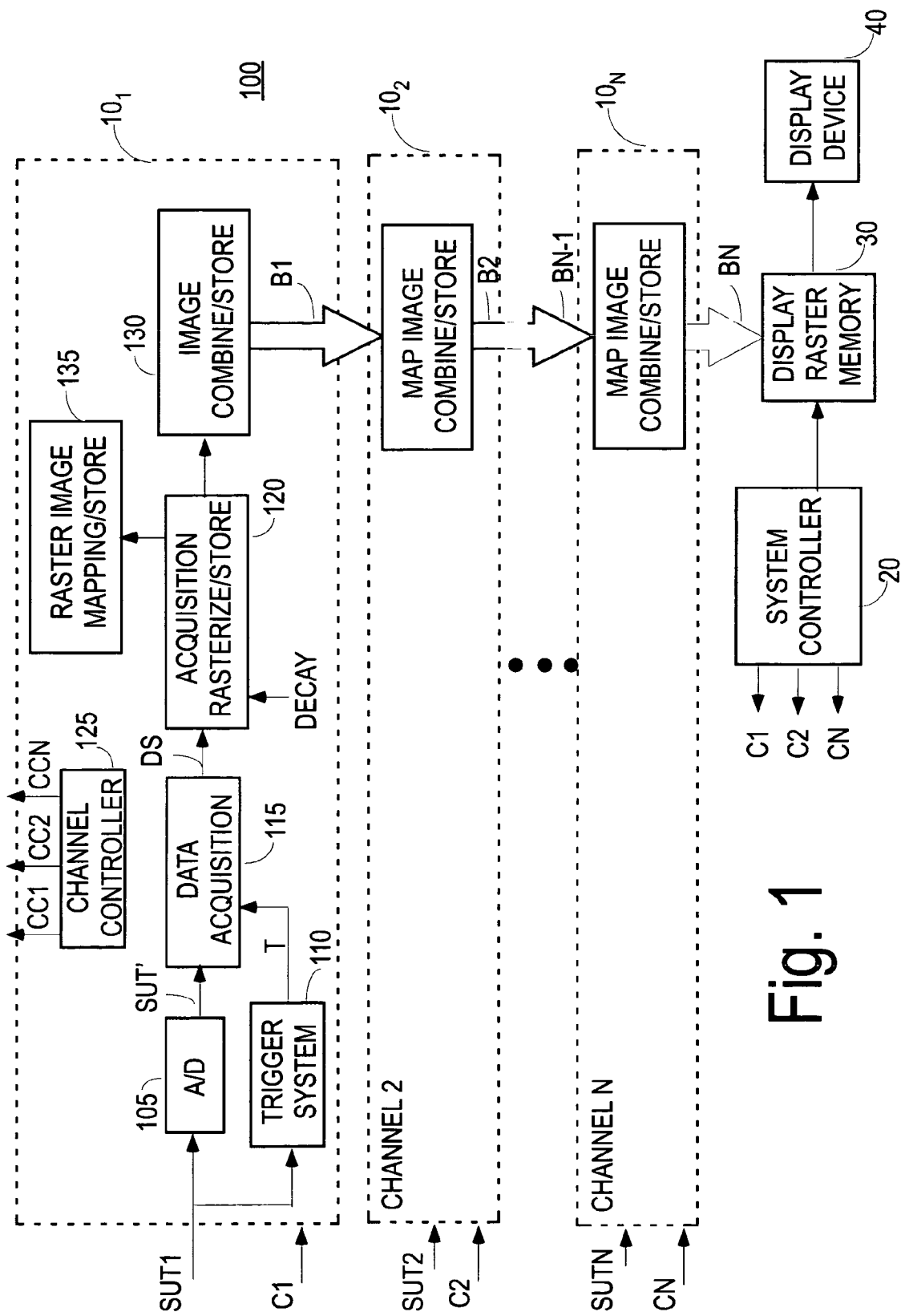
FIG. 1 depicts a high level block diagram of a signal acquisition system according to an embodiment of the invention.

FIG. 1 depicts a high level block diagram of a signal acquisition system according to an embodiment of the present invention. The signal acquisition system 100 of FIG. 1 receives and processes a plurality of (e.g., N) signals under test (SUT) to generate thereby respective waveform representations of the signals under test on a display device. The signal acquisition device 100 of FIG. 1 comprises a plurality of input channels $10_1$ through $10_N$ (collectively input channels 10), a system controller 20, a display raster memory 30 and a display device 40. Each of the input channels 10 communicates with at least one adjacent input channel via a point-to-point bus B.

Each of the input channels 10 receives a respective signal under test (SUT), which is digitized, acquired, rasterized and otherwise processed to produce and locally store the corresponding waveform or vectorized imagery and its intermediate sub-components. The waveform imagery from all (active) input channels 10 is then combined and stored in the display raster memory for subsequent display on the display device 40. The display device 40 comprises, illustratively, a liquid crystal display (LCD), cathode ray tube (CRT) or other display device operating in a substantially conventional manner to extract field or frame data from the display raster memory at a known rate (e.g., 60 frames per second) and display the extracted data.

In the embodiment of FIG. 1, waveform imagery generated by each input channel 10 is coupled to a next input channel (of a logical sequence of input channels) via a respective portion of a point to point communications bus B. Each input channel combines its respective waveform imagery with the waveform imagery received from the previous input channel to generate thereby a respective combined image. It is the combined image that each input channel propagates to the next input channel. It is noted that the first input channel does not receive an image for combination, and that the final input channel (e.g., input channel $10_N$) produces a combined image including waveform representative data from each of the input channels $10_1$ through $10_N$, which final combined image is stored in the display raster memory 30.

Each input channel 10 comprises an analog-to-digital (A/D) converter 105, a trigger system 110, a data acquisition circuit 115, an acquisition rasterize/store module 120, a channel controller 125, a raster image mapping/store module 135, and a map image combine/storage module 130. In the present discussion, is noted that the system controller 20 produces a plurality of control signals $C_1$–$C_N$ (collectively control signals C), each of which is used to control, or to direct the channel controller to control, functional elements or processes within corresponding input channels $10_1$–$10_N$. Likewise, in the present discussion, is noted that the channel controller 125 produces a plurality of control signals $CC_1$–$CC_N$ (collectively control signals CC), each of which is used to control functional elements or processes within the corresponding input channels $10_1$–$10_N$. While the control signals C and CC are denoted as single control signals, it will be appreciated that each of control signals $C_1$–$C_N$ and $CC_1$–$CC_N$ may comprise respective pluralities of control signals which operate to enable control of multiple functional elements and processes within the input channels 10. The specific linkages between the control signals C/CC and functions/processes are omitted from the drawings to aid in clarity.

For each input channel 10, the A/D converter 105 receives and digitizes a respective signal under test (SUT) in response to a sample clock (not shown) to produce a corresponding stream of digital samples SUT'. The sample clock is preferably a clock signal adapted to cause the A/D converter 105 to operate at a maximum sampling rate, though other sampling rates may be used. For simplicity of discussion, the A/D converter will be primarily described as an 8-bit A/D converter operating at a sample rate of 2.5 billion samples per second. These parameters (e.g., sample clock frequency, A/D converter bit width, and input bandwidth) may be changed depending on the desired application or product price-performance level.

The stream of samples SUT' produced by the A/D converter 105 is coupled to the data acquisition circuit 115. The data acquisition circuit 115 comprises, illustratively, a decimator or other sample set reduction circuit that optionally processes the stream of samples SUT' received from the A/D converter 105 according to a respective processing algorithm or decimation mode, such as a sub-sampling mode, a peak detection mode (e.g., min-max detection), a high resolution mode (e.g., a box-car averaging mode) or other mathematical function, algorithm or mode. In a "pass through" mode, no decimation or sample reduction is performed. The decimation mode of the data acquisition circuit 115 may be preprogrammed such as with an application specific integrated circuit (ASIC), or may be programmed "on the fly" in response to a control signal provided by, for example, the system controller 20 or channel controller 125. The data acquisition circuit produces a stream of decimated samples DS that is coupled to the acquisition rasterize/store module 120 either directly or via the acquisition memory where DS is stored (not shown). The generation of the sample stream DS is performed in response to a trigger signal T produced by the trigger system 110.

The trigger system 110 asserts the trigger signal T in response to the detection of an analog triggering function or condition such as a rising edge, falling edge, specific pulse width and/or runt triggering condition and the like within the respective signal under test SUT. The trigger signal T is utilized by the data acquisition circuit 115 to responsively process at least that portion of the stream of samples SUT' temporally proximate the asserted trigger signal T. For example, the data acquisition circuit 115 may provide to the acquisition rasterize/store module 120 a decimated sample stream comprising samples acquired at or before the time of trigger assertion (i.e., pre-trigger samples) as well as samples acquired following the trigger assertion. It is noted that the trigger system 110 may support trigger hold-off periods including pre-trigger and post-trigger hold-off periods as well as other temporal offsets which may be employed to modify the trigger behavior of the data acquisition circuit 115. The trigger system 110 is responsive to a trigger control signal produced by, illustratively, the system controller 20 to modify trigger conditions, hold-off periods and the like.

The acquisition rasterize/store module 120 receives the decimated (or "passed through") sample stream DS produced by the data acquisition system 115. In one embodiment, the acquisition rasterize/store 120 processes the sample stream DS to produce histographic data representing the sample value distribution of the samples associated with each of respective pluralities of time slices forming respective display frames, where a time slice is defined as the vertical pixels corresponding to a single horizontal pixel in a display frame. The histographic representations of the acquired SUT time slices comprise a raster image RI that is then stored in respective portions of raster image memory. That is, for each of a plurality of time slices (horizontal increments) forming a raster image frame, where each of the time slices tend to include many sample points from the very high speed A/D converter 105, a representation of a sample value or vertical parameter for that time slice is determined. This may be determined using the histographic technique described above, by simply averaging all of the samples occurring during that time slice, by selecting the vertical pixel most frequently associated with the data points in the time slice or by other means. In any event, for each time slice a corresponding voltage level or vertical deflection point is determined and the corresponding pixel(s) illuminated. Subsequently, the raster image RI produced by the acquisition rasterize/store module 120 is coupled to the raster image mapping/store module 135 either directly or via the raster image memory.

The acquisition rasterize/store 120 implements a decay function acting on a preexisting raster image such that a resulting waveform image exhibits a persistence or decay function similar to that in analog cathode ray tube (CRT) oscilloscope displays. Specifically, an "attack" function is implemented by the acquisition rasterize/store module 120 modifying an appropriate pixel(s) within a time slice according to an appropriate illumination level of that pixel(s) as determined by the techniques described above. The decay function comprises the reduction of that illumination level over time. Thus, the acquisition rasterize/store module 120 implements pixel or image processing algorithms that provide the attack and decay functions familiar to users of CRT display systems.

The decay function is implemented using, for example, the channel controller 125, which periodically indicates to the acquisition rasterize/store module 120 that the luminance (or chrominance) value associated with each sample point should be reduced by some amount. The amount of value reduction may be determined as a linear or non-linear function such that over some period of time (i.e., a "decay" period) the luminance or chrominance value associated with a particular sample point is reduced to zero. This decay function is implemented in a similar manner within each of the input channels 10 within the signal acquisition system 100 of FIG. 1.

The raster image mapping/store module 135 receives the rasterized image RI (e.g., histographic representation) produced by the acquisition rasterize/store module 120. In one embodiment, the raster image mapping/store module 135 processes the raster image to create a map image that is more compatible for the display device. The image processing performed by the raster image mapping/store module 135 may, for example, include pixel depth reduction via a data compression algorithm, swapping of the major and minor presentation axis, adding flag bits and identification fields to each pixel, and making other format changes that are display device dependent. The resultant reformatted waveform image produced by the raster image mapping/store module 135 represents a map image MI and is stored in respective portions of the map image memory. Subsequently, the map image MI is coupled to the map image combine/store module 130 either directly, or via the map image memory.

The map image combine/storage module 130 operates to combine the mapped imagery (e.g., display device compatible histographic representation) of its respective SUT with mapped imagery provided by a prior channel. The combined mapped imagery is then forwarded to the next channel via a respective portion of a point-to-point bus B. Thus, in the case of the first channel $10_1$, there is no prior input channel and the map image combine/storage module 130 of the first channel $10_1$ merely forwards the mapped imagery to second channel $10_2$ via a respective portion $B_1$ of the point-to-point bus B. The map image combine/store module 130 of second channel $10_2$ combines the mapped imagery received from first channel $10_1$ with the mapped imagery generated by the raster image mapping/store module 135 of second channel $10_2$ to produce a combined mapped imagery. The combined mapped imagery (i.e., signals $SUT_1$ and $SUT_2$ mapped imagery) is then propagated to the third input channel $10_3$ via a respective portion $B_2$ of the point-to-point bus B. This process is repeated for all input channels up to the final or $N^{th}$ input channel $10_N$. The $N^{th}$ input channel $10_N$ receives a combined waveform imagery of the first through $N^{th-1}$ input channels via a respective portion $B_{N-1}$ of the point-to-point bus B. The map image combine/store module 130 of the $N^{th}$ channel $10_N$ combines the $SUT_N$ mapped imagery with the combined mapped imagery of the previous channels to produce a final combined waveform image. The final combined waveform image is then propagated to the display raster memory 30 via respective portion $B_N$ of the point-to-point bus B.

While not shown in FIG. 1, the mapped imagery from each of the input channels is temporally aligned such that the final combined image provides an accurate, temporally aligned composite image of all the input channel images used. In one embodiment of the invention, the temporal alignment is provided by delaying each acquired data stream by an amount ranging from zero (for the $N^{th}$ input channel) to a maximum amount (for the first input channel). The amount of delay is selected to represent the processing time required to propagate the waveform images through each of the N input channel map image combine/store modules 130.

In an alternate embodiment of the invention, a delay is imparted by each map image combine/store module 130 such that an image waveform received from a prior input channel is offset by a fixed amount such that the waveforms that propagate the system remain temporally aligned. In one embodiment of the invention, the processing time for waveform generation is deemed to be negligible, and the acquisition and processing speeds so great that imparting of delays from channel-to-channel is deemed unnecessary.

In one embodiment of the invention, a common triggering scheme is implemented whereby each of the input channels is triggered using a common trigger circuit. In this embodiment of the invention, the waveform imagery produced by each of the input channels is inherently temporally aligned. Where non-common triggering is used, it may be appropriate for additional temporal alignment processes to be implemented, as discussed above.

In various alternate embodiments of the invention, the raster and display control functions discussed above are implemented by the acquisition rasterize/store module 120, channel controller 125, raster image mapping/store module 135 and map image combine/storage module 130 either singly or in any combination. As such, it is noted that the specific functional delineations discussed above with respect to these elements may be modified and that such modification is contemplated by the inventor.

Figure 2:
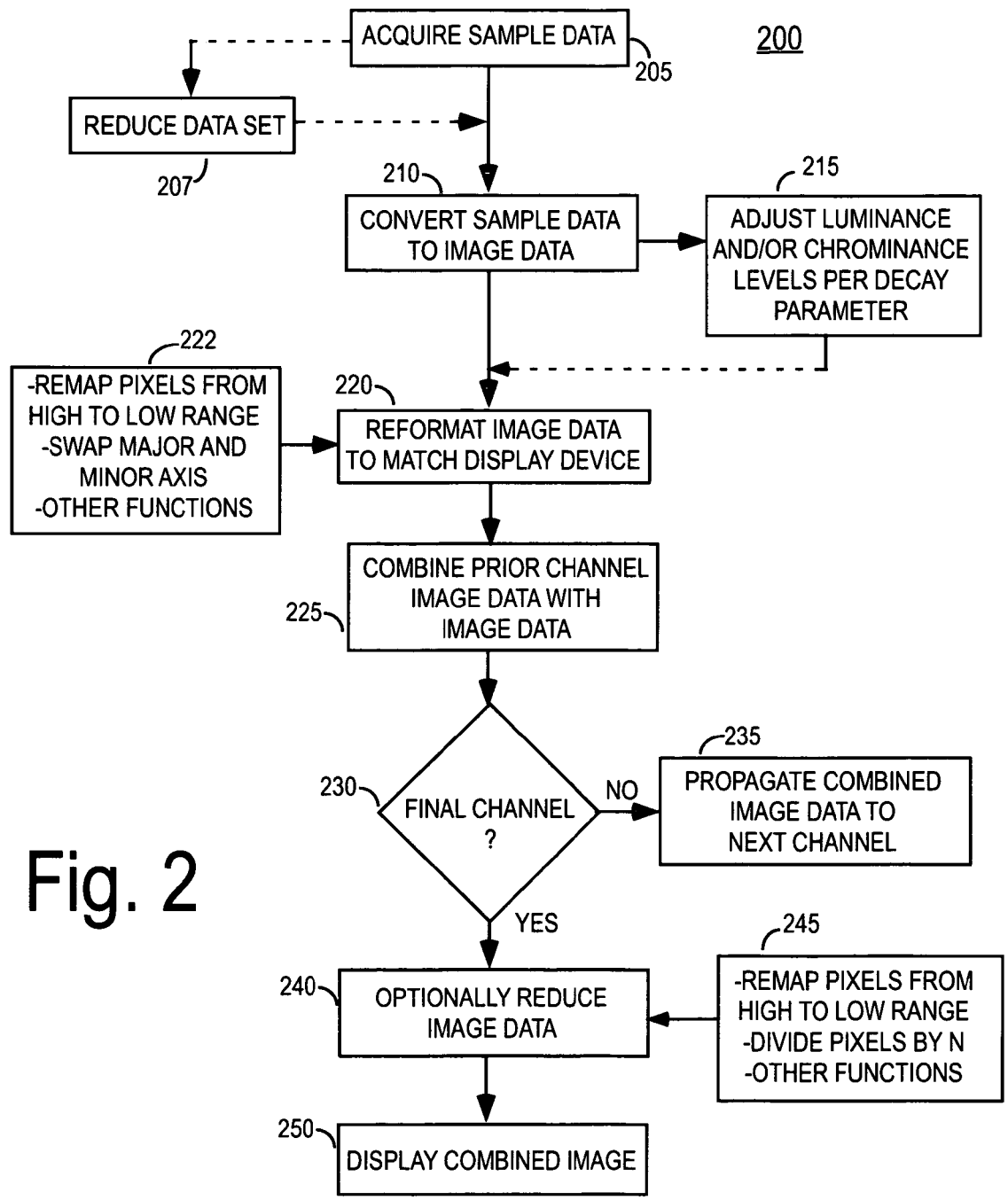
FIG. 2 depicts a flow diagram of a method according to an embodiment of the present invention.

FIG. 2 depicts a flow diagram of a method according to an embodiment of the invention. Specifically, the method 200 of FIG. 2 comprises various steps and functions repeatedly performed by each of the input channels 10 within the system 100 of FIG. 1.

At step 205, the input channel 10 acquires sample data. At optional step 207, the acquired sample data set is reduced by a decimation or other sample reduction function. At step 210, the sample data is converted to raster image data using histographic techniques or other techniques. At optional step 215, the luminance and/or chrominance levels of the preexisting pixels representing the waveform data generated at step 210 are adjusted per a decay parameter. That is, in one embodiment of the invention, the rasterize/store 120 used to convert sample data into image data operates to reduce the intensity level (or a chrominance parameter) of the pixel data in response to a signal provided by channel controller 125 or, more generally, a decay signal indicative of the appropriate amount of luminance/chrominance reduction over time. In this manner, pixel intensity is adapted to emulate a persistence function or decay function as discussed above with respect to FIG. 1.

At step 220, the raster image data is reformatted to match the requirements of the display device. That is, refering to step 222, in one embodiment of the invention, the major axis and minor axis of the raster image must be transposed to match the orientation of traditional LCD or CRT display devices. Traditional LCD and CRT display devices also require the pixel widths be remapped from large values (e.g. 32-bits wide, 26-bits wide) as might be used in the raster image to smaller values (e.g., 5-bits wide, 4-bits wide), which is done at step 220. The remapping function may be linear, or nonlinear. Other functions such as adding pixel identification field of bits to the map image pixel can be done at step 220.

At step 220, in one embodiment of the invention, the remapping of pixel data from high range to low range as described above is performed on the raster image already stored in raster image memory thus maintaining the original histographic representation of the waveform image. That is, the remapping produces pixel values for a new map image without altering the current raster image. Therefore the raster image retains the original data precision and allows the subsequent reuse for later display images, or for waveform measurement calculations. Other functions may be used to impart intensity and/or chrominance information modification to the pixels formed in the raster image. For example, in one embodiment of the invention, each of the pixels forming an image has an intensity depth of 26 bits. By using such a large number of pixels to represent intensity, subtle variations in intensity level may be realized such that persistence-emulating functions such as attack and decay may be performed with a higher degree of accuracy. However, where a display device has a relatively low (e.g., 8-bits) pixel depth, the display pixel depth may be substantially reduced. Moreover, the large intensity depth or pixel depth enables a relatively fine gradation of a decay function such that the persistence emulation is performed in a very accurate manner.

At step 225, the mapped image data from a prior channel is accepted. That is, at step 225 the mapped image data provided via a respective portion of the point-to-point bus B coupling a previous input channel image combine/store function to the present input channel image combine/store function is used to receive the waveform image data from the prior channel. Also at step 225, the prior channel waveform image data is combined with the present channel waveform image data by the map image combine/store module 130. In the case of a first input channel, there is no prior channel from which to receive waveform image data for combination and, therefore, such a combination step is not used.

At step 230, a determination is made as to whether the method 200 of FIG. 2 is implemented within a final channel (i.e., channel $10_N$). If the query at step 230 is answered negatively, then the method proceeds to step 235 where the combined image data of step 225 is propagated to the next input channel. If the query at step 230 is answered affirmatively, then an optional image data reduction process is invoked. That is, referring to box 245, the pixel depth for each of the pixels within the combined image may be divided by some value X, and other functions may be applied. The division function is a modified linear function. That is, in one embodiment, after a straight division is applied to the output pixel any nonzero values less than one are rounded up to the value of one to insure that all visible pixels have a nonzero intensity value.

At step 250 the combined image is displayed on, for example, the display device 40. Display occurs when the map image combine/store module 130 within the $N^{th}$ input channel $10_N$ stores the combined waveform image including all N waveform images in the raster display memory 30. The display device 40 extracts, illustratively, one frame of display information from the raster memory every 60 seconds. Other frame (or field) rates may be advantageously employed within the context of the present invention.

By moving the gray scale decay processing directly into the demux unit of an individual channel, the above-described invention advantageously eliminates the modal behavior of prior art gray scale attack/decay systems while eliminating the need for expensive custom display integrated circuits. Each input channel 10 acquires and rasterizes a respective SUT to produce a respective image. The rasterization process is modified by a timer function which causes the waveform-related pixels to be reduced in intensity such that the SUT-representative image exhibits an intensity (or chrominance) decay function analogous to that previously found on analog CRT displays. Each of the input channels 10 performs a similar decay function for respective acquired signals.

By combining images from preceding to next input channels on an image by image (or waveform by waveform) bases, the individual decay functions implemented by each input channel 10 are preserved within the combined image. The resulting total combined image produced by the $N^{th}$ ($10_N$) input channel and stored in display raster memory 30 comprises waveform data from each of the N channels where each waveform provided by the N channels is appropriate decayed in the desired analog CRT-like manner. Thus, the desire to preserve CRT-like behavior is maintained within the context of a system providing very high data throughput.

While the foregoing is directed to the preferred embodiment of the present invention, other and further embodiments of the invention may be devised without departing from the basic scope thereof, and the scope thereof is determined by the claims that follow.

What is claimed is:

1. A method for use in a multiple channel digital storage oscilloscope (DSO), comprising:
    for each of a plurality of input channels, performing the steps of:
        converting a sample stream of a respective acquired signal under test (SUT) into respective waveform image data;
        modifying said respective waveform image data by reducing at least one display parameter according to a decay function; and
        providing said modified waveform image data to an image combiner;
    wherein:
        for a non-final channel, said step of providing comprises the step of transmitting said modified waveform image data to an adjacent non-initial input channel via a point-to-point bus; and wherein:
for each non-initial input channel, further performing the steps of:
receiving modified waveform image data from an adjacent input channel via said point-to-point bus; and
combining said received waveform image data with said modified waveform image data prior to transmitting said modified waveform image data to said adjacent input channel via said point-to-point bus.

2. The method of claim 1, wherein:
said step of converting comprises a step of rasterizing said acquired signal under test (SUT) into sample stream to provide said waveform image data; and
said step of reducing comprises reducing an intensity level for each pixel represented by said waveform image data.

3. The method of claim 1, wherein:
said step of converting comprises a step of rasterizing said acquired signal under test (SUT) into sample stream to provide said waveform image data; and
said step of reducing comprises reducing a chrominance level for each pixel represented by said waveform image data.

4. The method of claim 1, wherein each non-final input channel in a sequence of input channels moves a respective combined image to a successive input channel, wherein a final input channel moves a final combined image to a raster memory.

5. The method of claim 1, wherein:
said step of converting further comprises a step of reformatting said waveform image data to adapt to a display device format.

6. The method of claim 5, wherein:
said step of reformatting comprises the step of remapping said waveform image data to reduce a pixel depth of said waveform image data.

7. The method of claim 5, wherein:
said step of reformatting comprises the step of exchanging major and minor axis of said waveform image data to adjust a shape parameter of said waveform image data.

8. In a system comprising first, final and at least one intermediate input channels, each of the input channels periodically acquiring a respective signal under test (SUT) and generating rasterized waveform imagery therefrom, a method comprising:
causing the first input channel to propagate its respective waveform imagery to a next input channel;
causing each intermediate input channel to combine its respective waveform imagery with waveform imagery received from a prior input channel and propagate the combined image to a next input channel; and
causing the final input channel to combine its respective waveform imagery with waveform imagery received from a prior input channel and propagate the combined image to a display raster memory for subsequent display.

9. The method of claim 8, wherein said system comprises a digital storage oscilloscope (DSO).

10. The method of claim 8, further comprising:
causing said first, intermediate and last input channels to modify respective waveform imagery by reducing at least one display parameter according to a decay function.

11. The method of claim 10, wherein:
said modifying comprises reducing at least one of a luminance display parameter and a chrominance display parameter according to a decay function.

12. The method of claim 8, further comprising:
causing each of said input channels to reformat its respective waveform imagery to adapt to a display device format.

13. The method of claim 12, wherein:
said reformatting comprises remapping said waveform imagery to reduce a pixel depth parameter.

14. The method of claim 8, wherein:
said reformatting comprises of exchanging major and minor axis of said waveform imagery to adjust a shape parameter.

15. Apparatus, comprising:
a plurality of input channels, each of said input channels comprising:
acquisition circuitry adapted to acquire a respective signal under test (SUT);
a rasterizer, adapted to rasterize said acquired respective SUT to periodically produce a respective waveform image; and
an image combiner, adapted to combine said periodically produced waveform image with a waveform image received from a prior input channel; and
a raster memory, adapted for use by a display device, for periodically receiving a waveform image from a final one of said plurality of input channels.

16. The apparatus of claim 15, further comprising:
a raster image processor, for modifying respective waveform imagery by reducing at least one of a luminance display parameter and a chrominance display parameter according to a decay function.

17. The apparatus of claim 15, further comprising:
a raster image processor, for reformatting respective waveform imagery to a display device format.

18. The apparatus of claim 17, wherein:
said reformatting comprises at least one of remapping said waveform imagery to reduce a pixel depth parameter and exchanging major and minor axis of said waveform imagery to adjust a shape parameter.

19. Apparatus, comprising:
a display memory; and
a plurality of input channels logically arranged as a sequence of input channels comprising a first input channel, at least one intermediate input channel and a last input channel;
each of said input channels comprising:
acquisition circuitry adapted to acquire a respective signal under test (SUT); and
a rasterizer, adapted to rasterize said acquired SUT to periodically produce a respective waveform image;
said first input channel communicating its respective waveform image to a first of said intermediate input channels;
each of said intermediate input channels combining a received waveform image with a respective periodically produced waveform image to produce a respective combined waveform image;
each of said intermediate input channels communicating said respective combined waveform image to a next input channel in said sequence of input channels;
said final input channel combining a received waveform image with a respective periodically produced waveform image to produce a final combined waveform image for storage in said display memory.

* * * * *